United States Patent [19]
Larrison

[11] 3,934,783
[45] Jan. 27, 1976

[54] MULTIFACE WIRE BONDING METHOD AND TOOL

[76] Inventor: John E. Larrison, 2949 Baker St., Costa Mesa, Calif. 92626

[22] Filed: Sept. 30, 1974

[21] Appl. No.: 510,416

[52] U.S. Cl. .................................. 228/110; 228/1
[51] Int. Cl.² .......................................... B23K 1/06
[58] Field of Search .............. 228/2, 3, 1, 4, 5, 13; 29/470, 470.1, 470.3; 156/73.5

[56] References Cited
UNITED STATES PATENTS

| | | | |
|---|---|---|---|
| 3,347,442 | 10/1967 | Reber | 228/3 |
| 3,627,192 | 12/1971 | Killingsworth | 228/1 X |
| 3,648,354 | 3/1972 | Mashino | 29/470.1 |

Primary Examiner—Al Lawrence Smith
Assistant Examiner—Margaret Joyce
Attorney, Agent, or Firm—Allan Rothenberg

[57] ABSTRACT

A conductive wire is bonded to spaced parts of a semiconductor device by an ultrasonic bonding wedge that is formed with side-by-side bonding faces of mutually different inclinations. One of the faces makes a forward bond having a lesser deformation at an inner end of the bond. The other of the bond faces is employed to make a rear bond in which a greater deformation is made at an outer end of the bond to facilitate parting of the wire at the second bond. A wire guide movably mounted adjacent the bonding wedge laterally shifts the wire from one bond face to the other.

39 Claims, 28 Drawing Figures

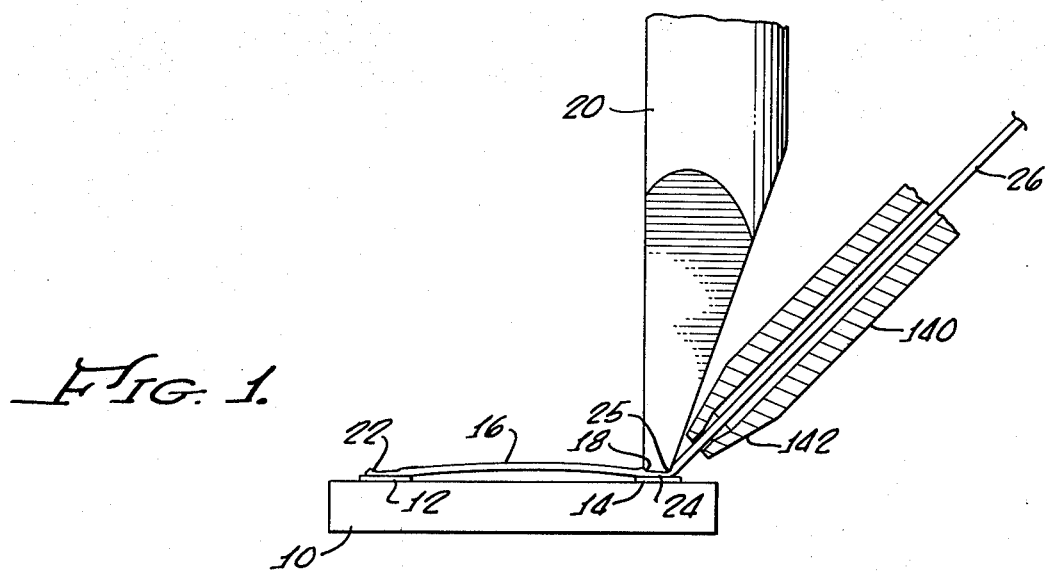
FIG. 1.
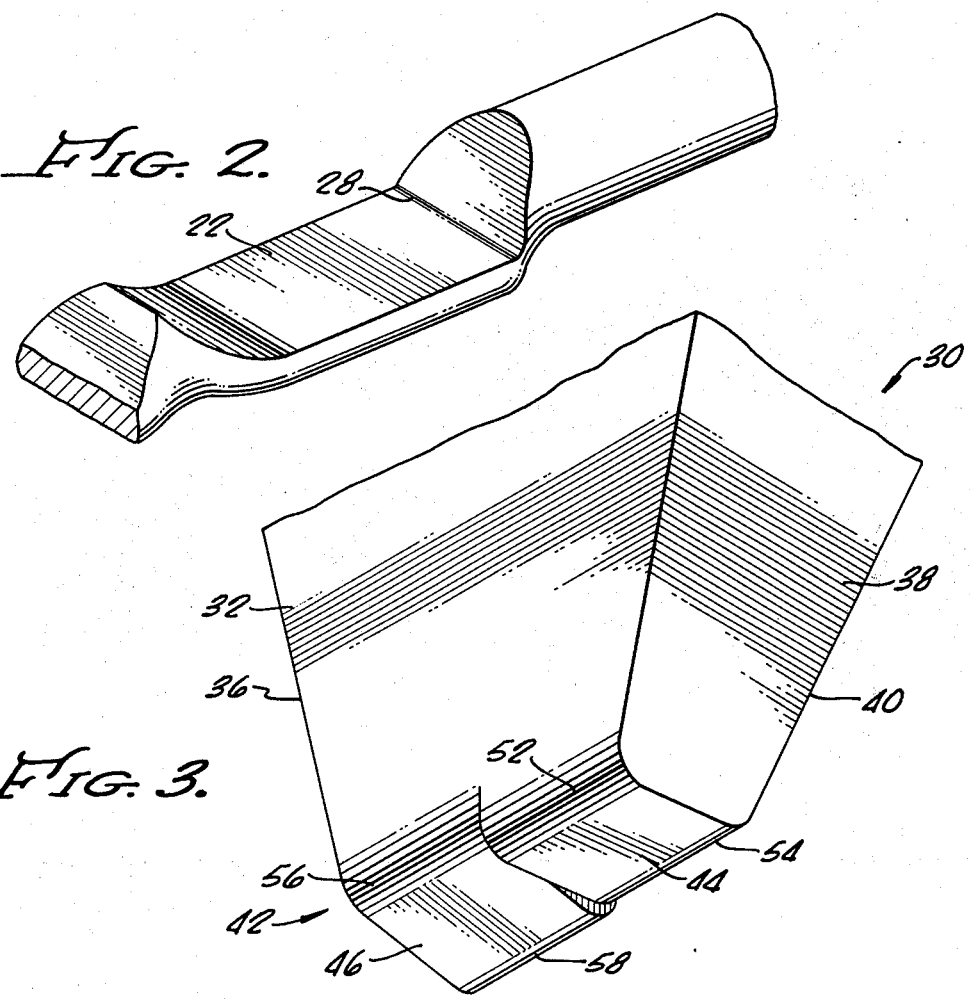
FIG. 2.
FIG. 3.

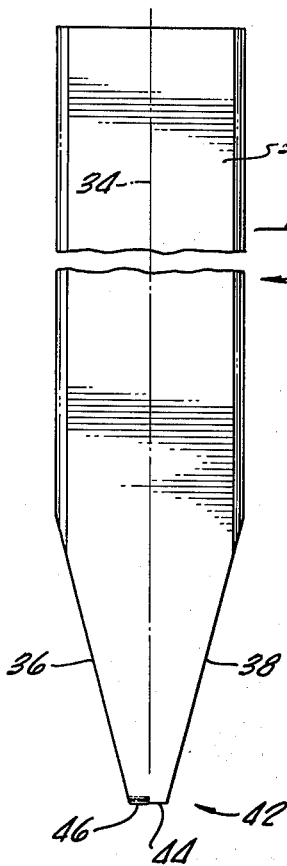
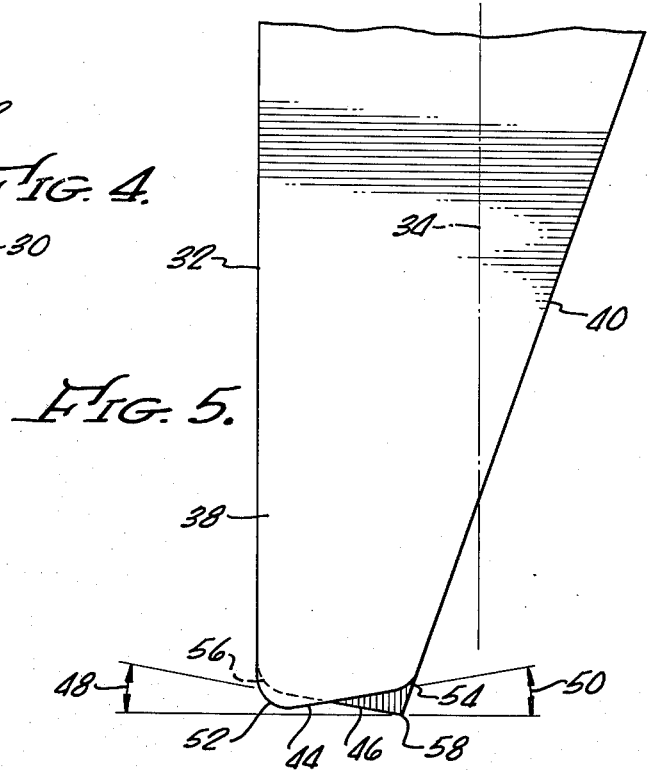
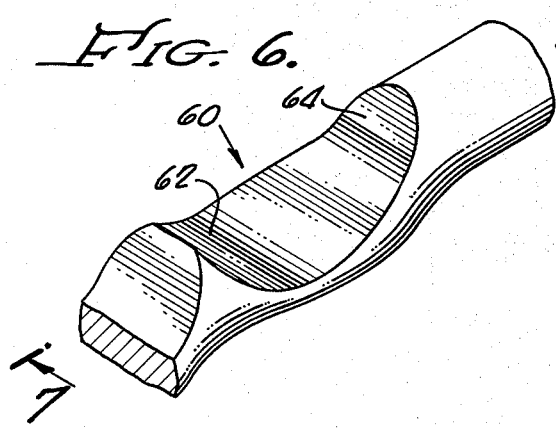
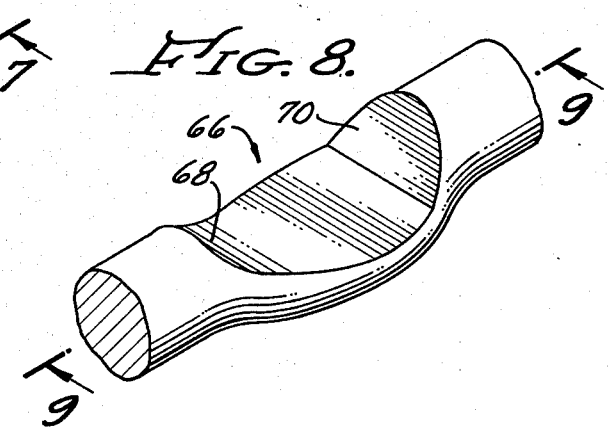
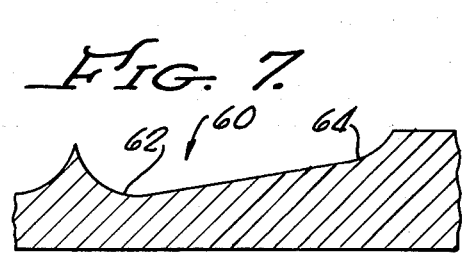

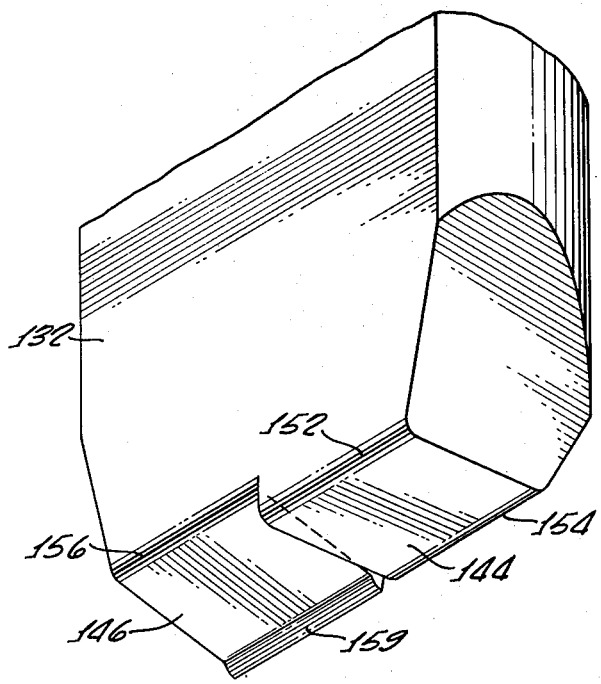
FIG. 10.
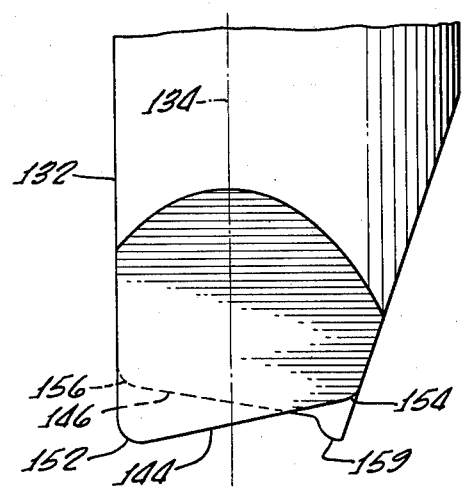
FIG. 12.
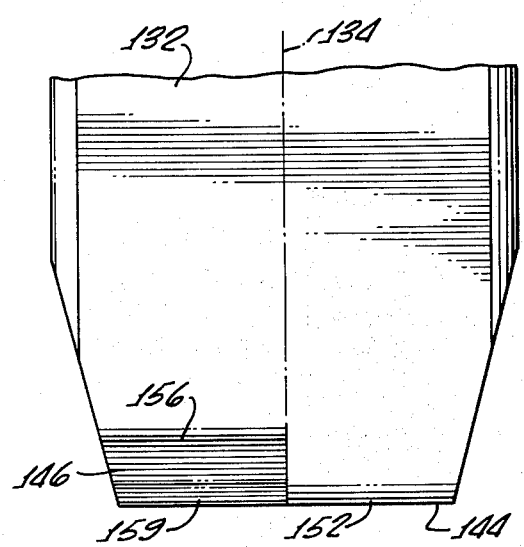
FIG. 11.
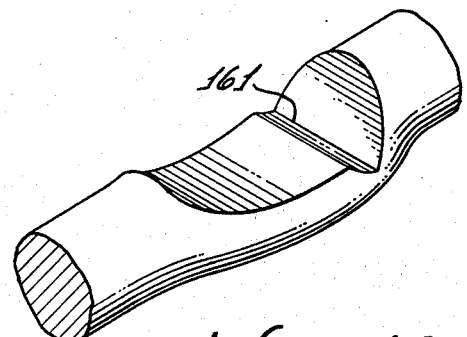
FIG. 13.
FIG. 14.
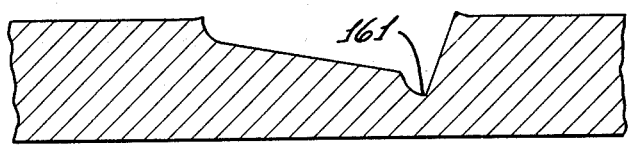

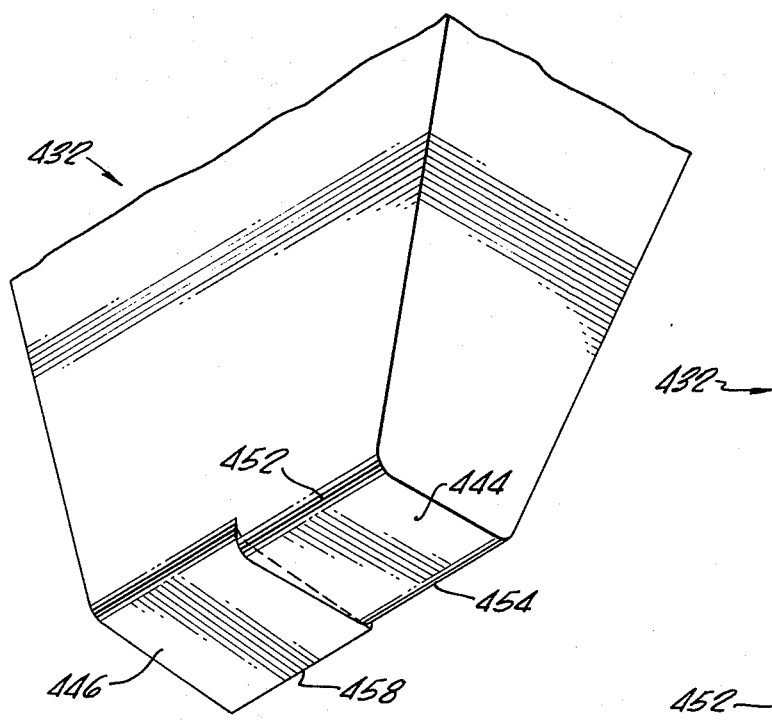 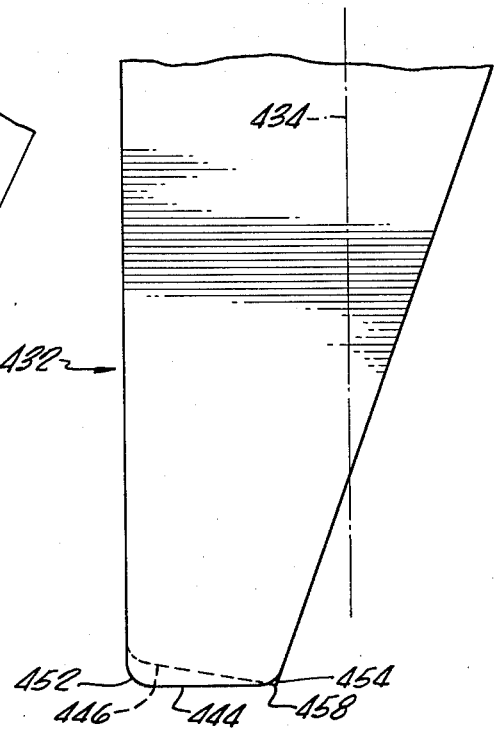
FIG. 19.  FIG. 20.
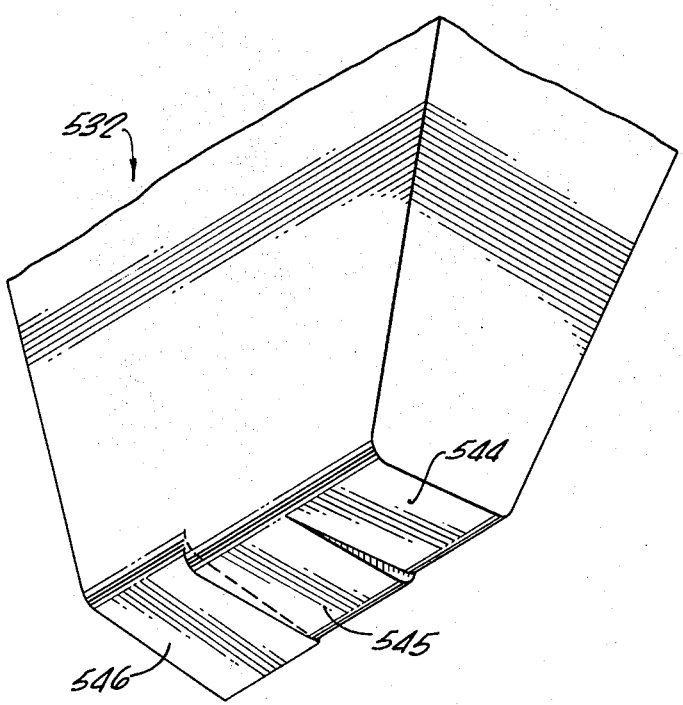 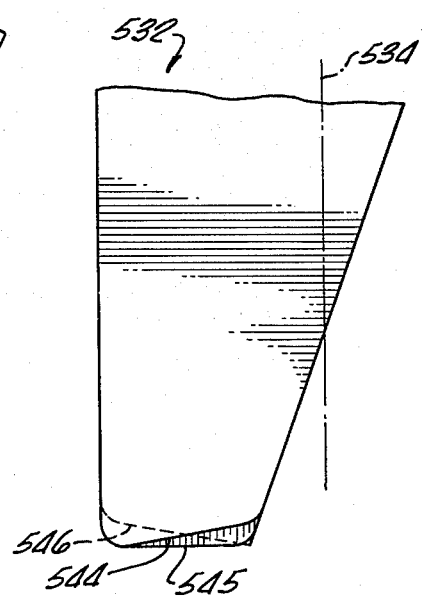
FIG. 21.  FIG. 22.

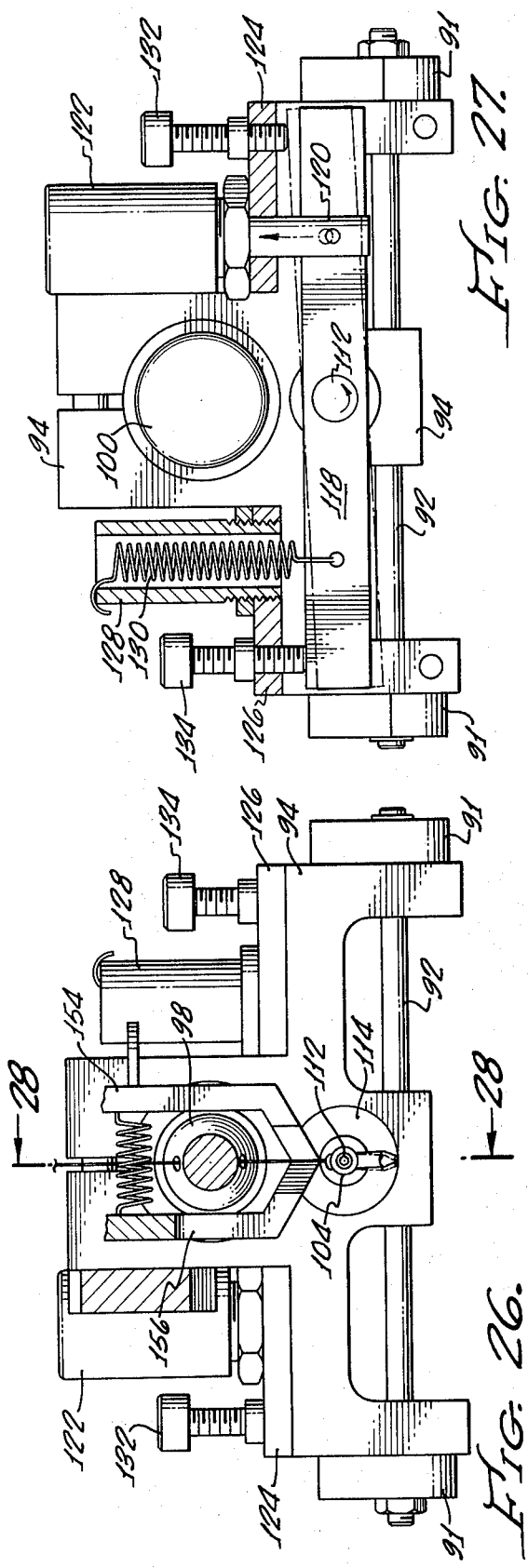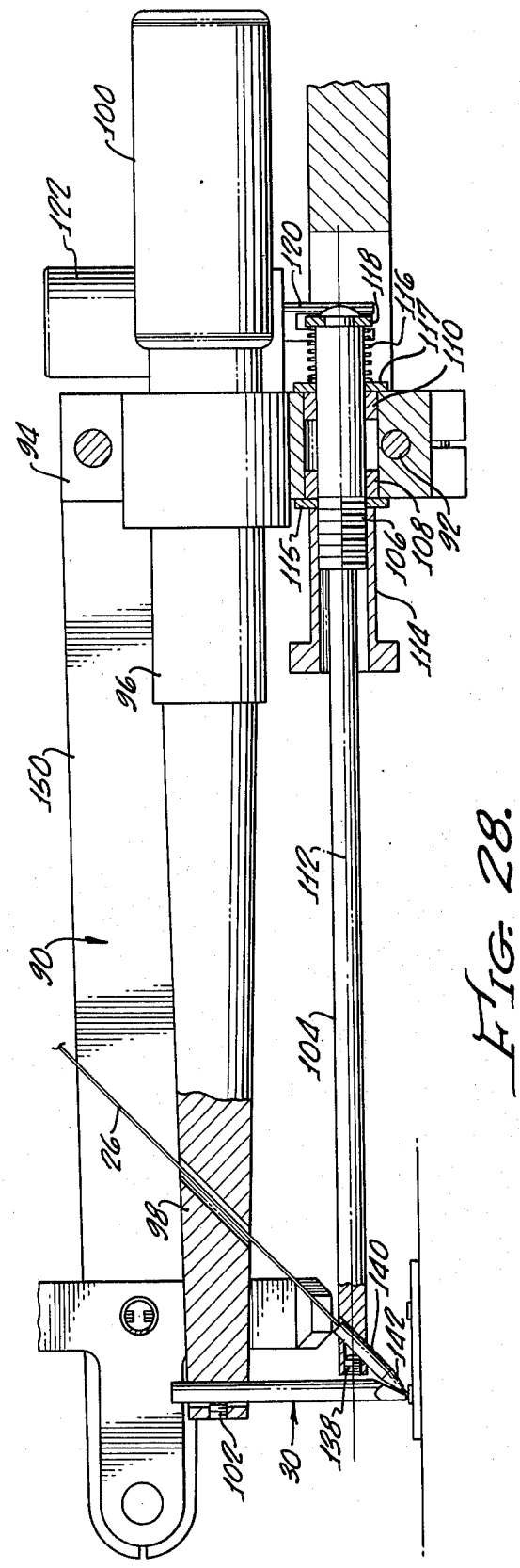

MULTIFACE WIRE BONDING METHOD AND TOOL

BACKGROUND OF THE INVENTION

The present invention relates to methods and apparatus for bonding of filamentary type wires and more particularly concerns such methods and apparatus for making improved multiple bonds of a single wire to a semi-conductor device.

In the manufacture of semi-conductor devices, small diameter wires, often having a diameter considerably less than the diameter of a human hair, are attached ultrasonically or by thermal compression to and between various contact areas on the devices. These filamentary wires and their connections are a major cause of reliability problems encountered in such semi-conductive devices. Problems include poor metallization, variable wire cross-section, improperly mounted chips, and machine variables including holding fixtures, among others. All of these difficulties may contribute to a faulty bond of the connecting wire.

Inadequacies of the bond produced by prior art ultrasonic techniques are fundamentally two in number. The first of these is termed "heel cracking" or "necking". This is caused by an increased deformation, e.g. decreased cross-sectional area and concomitantly increased stress concentration, at the inner end of the first bond of a wire that is to be bonded between two points. Consequently, upon subsequent handling of the wire or the bonded device, the wire may break at the point of increased stress concentration, causing an undesirable open circuit.

A second bonding problem is associated with heavy wire cut-off. The term "heavy wire", as employed with regard to semi-conductor connecting wires, refers to wires in the order of five to twenty thousandths of an inch in diameter, whereas the term "light wire" refers to wires generally less than five thousandths of an inch, and normally not greater than two thousandths of an inch in diameter.

Upon completion of the second bond of a heavy wire, the wire must be parted, or cut, at the outer end of the second bond as close to the bond and contact pad as possible. This is done to avoid a protruding tail that may interfere with other closely adjacent contact pads or wires. In some arrangements, it is necessary to provide a separate cut-off knife and thus, an additional step is required for parting of heavy wire. Other prior arrangements for heavy wire parting are shown in the patents to Reber U.S. Pat. No. 3,347,442 and Machino et al. U.S. Pat. No. 3,648,354.

Typical apparatus for ultrasonic wire bonding in which the bonding wedge is rocked for the second bond cut-off are shown in the patents to Pennings U.S. Pat. Nos. 3,305,157 and 3,328,875.

The cut-off blade is complicated, expensive, difficult to repair and adjust, potentially destructive to the semi-conductive devices, and is easily damaged. In tilting machines, attempts have been made to decrease the effects of the necking or heel cracking by tilting the bonding wedge forward during the first bond and rearwardly during the second bond. However, because of practical mechanical considerations, the amount of tilt is so small as to be of questionable value.

In the patents to Eltzroth et al. U.S. Pat. Nos. 3,689,983 and 3,718,272, a bonding wedge is provided with forward and aft longitudinally extending relief grooves for the purposes of minimizing necking of the wire at the bonds. Although this arrangement may somewhat decrease the necking problem, it can only aggravate the wire cut-off problem, particularly with regard to heavy wire, because the very arrangement that is directed toward solution of the necking problem inherently intensifies the cut-off problem.

Recognizing the conflict between heel cracking or necking on the one hand and wire cut-off requirements on the other, U.S. Pat. No. 3,627,192 to Killingsworth suggests a balance between a sharp corner which would facilitate breaking the wire, and a rounded corner which would reduce imprinting the wire, but which makes parting more difficult. Such a solution is a compromise at best and does not optimumly solve either of the two problems.

Accordingly, it is an object of the present invention to bond a wire at a first point with improved wire strength and at a second point with improved parting characteristics.

SUMMARY OF THE INVENTION

In carrying out principles of the present invention in accordance with a preferred embodiment thereof, a bonding wedge is provided with first and second side-by-side working heads having bond faces of mutually different configurations. A first configuration is optimized for a first bond and the second configuration is optimized for a second bond. The method of the invention is practiced by bonding a wire at a first point by means of a wire contact area of a first configuration and then bonding the same wire at a second point by means of a wire contact area of a second configuration. According to a feature of the invention, the two bond faces or contact areas are positioned side-by-side and the wire is shifted laterally from one to the other for making the first and second bonds respectively. Where the two bond faces are oppositely inclined, the wire is shifted back to registry with the first bond face after making the second bond.

BRIEF DESCRIPTION OF THE DRAWINGS

FIG. 1 illustrates a portion of a semi-conductor device and a filamentary type wire being bonded thereto;

FIG. 2 illustrates configuration of a wire section deformed for a first bond commonly made with prior art methods and apparatus;

FIG. 3 is a perspective view of a preferred embodiment of the tip of a bonding wedge of the present invention, having two bonding faces;

FIGS. 4 and 5 are side elevational views of the lower end of the bonding wedge of FIG. 3;

FIG. 6 is a perspective view of a wire section deformed for a first bond formed with the bonding wedge of FIG. 3;

FIG. 7 is a section of the wire section of FIG. 6;

FIG. 8 is a perspective view of a second bonded wire section made with the wedge of FIG. 3;

FIG. 9 is a cross-section of the bonded wire section of FIG. 8;

FIG. 10 is a perspective view of a modified bonding wedge having two bond faces;

FIGS. 11 and 12 are front and side elevational views respectively of the bonding wedge of FIG. 10;

FIG. 13 is a perspective view of a bonded wire section formed with the second bond face of the wedge of FIG. 10;

FIG. 14 is a sectional view of the bonded wire section of FIG. 13;

FIGS. 19 and 20 show a fourth modification of the bonding wedge of FIG. 3;

FIGS. 21 and 22 show a fifth modification of the bonding wedge of FIG. 3;

FIG. 26 is a section taken on lines 26—26 of FIG. 23;

FIG. 27 is a section taken on lines 27—27 of FIG. 23; and

FIG. 28 is a section taken on lines 28—28 of FIG. 26.

DETAILED DESCRIPTION

Figure 15:
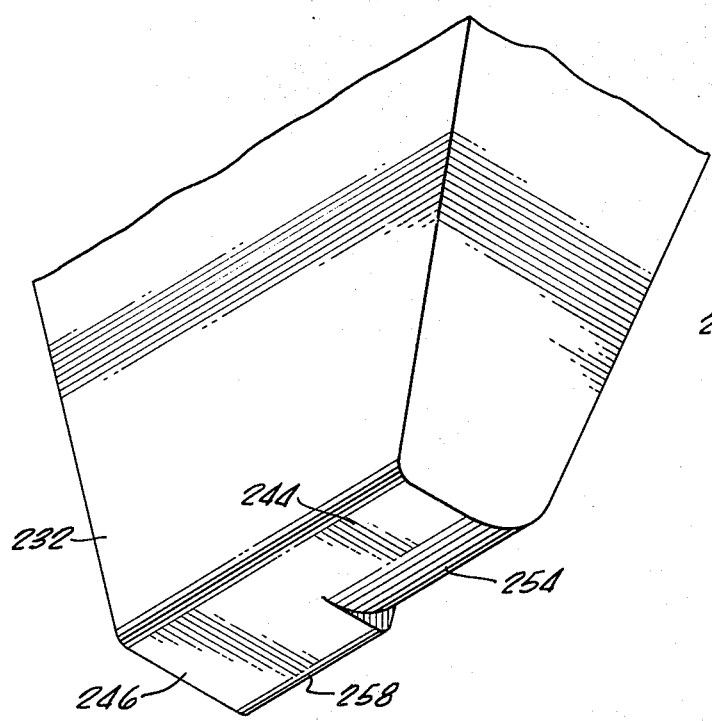
FIG. 15 is a perspective view of a second modification of the bonding wedge of FIG. 3.

Illustrated in FIG. 1 is a portion of a semi-conductor chip 10 having first and second contact pads 12, 14 between which a fine electrically conductive wire 16 is connected. Bonds that provide both physical and electrical connection between the wire and the pads are conventionally made by thermal compression bonding or by ultrasonic wire bonding. It will be readily appreciated, as the description proceeds, that principles of the present invention may be applied to either of these common types of fine wire bonding. Nevertheless, the invention has been embodied in methods and apparatus for ultrasonic bonding and it is with respect to ultrasonic bonding that preferred modes of practicing the invention are disclosed.

Ultrasonic bonds of the wire are made by pressing a wire contact area or bond face 18 or a bonding wedge 20 against a first section 22 of the wire and, while so pressing the wedge against the wire, employing an ultrasonic transducer (not shown in FIG. 1) to vibrate the wedge for a short time. The vibration is generally in a direction extending along the length of the wire. A peak to peak vibratory motion of some 50 to 100 microinches may be employed to form a secure mechanical bond between the wire section 22 and the pad 12. With the first bond of wire section 22 completed, the bonding tool, or wedge 20, is raised and moved rearwardly (to the right in FIG. 1) relative to the wire and the circuit chip or substrate 10, or the wedge is only raised and the chip is moved, until the wedge is positioned substantially vertically above a second point of contact, contact pad 14. The wedge is again lowered, pressing a second section 24 of the wire against the contact pad 14 and again simultaneously vibrating the bonding wedge for a short period. This completes the two bonds. Thereafter, according to various teachings of the prior art, a knife (not shown) may be employed to part the wire 16 at the outer end (toward the right in FIG. 1) of the second bond section 24, or as in the above-identified patents to Pennings, the bonding wedge may be pivoted rearwardly to press its heel 25 against the wire at the outer end of the bond section 24 thereby weakening the wire which is then parted by applying a tensile force thereto.

Even when bonding light wire, it is important according to prior art techniques, that the heel 25 of the bonding wedge 20 provide an area of increased stresses at the outer end of the bond so that the wire may be parted precisely at this point without a remaining "tail" and with a minimum of applied tensile force. Tensile force applied in parting the wire must be kept to a low value since a number of pairs of bonds may be made and tension is applied to a relatively long length of wire between a wire reel (not shown in FIG. 1) and a point at which the wire is to be parted. Thus, parts of the wire between the second bond and a wire supply reel are repeatedly subjected to the tensile force applied during parting of the wire at the several second bonds. This may considerably degrade reliability and uniformity of the wire connection.

For optimum characteristics of the first bond section 22, on the other hand, it is desirable to minimize the stress concentration at the inner end of the bond. Nevertheless, because the conventional tool is a compromise between characteristics desired for the first bond and characteristics desired for the second bond, the first bond may take a configuration such as that illustrated in FIG. 2, when employing prior art techniques. As can be seen in FIG. 2, the inner end of the first bond section 22 is formed with a heel mark 28 when using prior art techniques. At this heel mark 28, the cross-section of the wire is generally smaller because of extrusion of the wire longitudinally. The smaller cross-section provides a weakened area on the wire. In addition, there is a sharp discontinuity at the heel mark which provides a generally transverse line of greatly increased stress concentration.

It is this combination of decreased cross-sectional area and the so-called stress riser present in areas of increased stress concentration that causes heel cracking and accordingly, major reliability problems. Merely rounding the heel 25 or relieving its rearward edge will not solve the bonding problem. This is so because this very rounding to ease the necking and heel cracking of the first bond makes it difficult if not impossible to properly, efficiently and repeatedly sever the wire at exactly the outer or rearward end of the second bond. If the bonding wedge working head configuration is arranged to provide an area of increased strength at the rearward end of the first bond, it will likewise provide a bonding area of increased strength at the rearward end of the second bond. Thus, tensile force applied to the wire will not cause separation of the wire at the desired point since such point is not weakened. To the contrary, the wire may part at any place, leaving long and unwieldy tails and interfering with the subsequent feed of the wire for the next set of bonds. Alternatively, use of a knife for parting entails many difficulties and particularly endangers the sensitive and minute parts upon which the bonding takes place.

BONDING WEDGE

According to principles of the present invention, first and second bonds of a fine wire are made without compromise of either of the bonds. This is achieved by employing a pair of juxtaposed bonding surfaces or wire contact areas, each of which is made with a configuration that is optimum for one of the bonds that is to be made. Thus, as illustrated in FIGS. 3, 4 and 5, a bonding wedge 30 is formed with an elongated body 32 having a longitudinal axis 34 and side and rear surfaces 36, 38, 40 which taper to provide a working tip 42 of generally decreased dimensions.

In accordance with the present invention, the bonding wedge is formed with a pair of side-by-side working heads integral with each other. The two working heads provide a first bonding surface or wire contact area 44 and a second bonding surface or wire contact area 46, which are of mutually different configurations, each specifically arranged for a different one of the forward and rearward bonds. In the embodiment of FIGS. 3, 4, and 5, wire contact area 44 slopes upwardly and rearwardly with respect to the longitudinal axis 34 of the tool, whereas wire contact area 46, which is arranged to make the second bond of a pair, slopes upwardly and forwardly with respect to the axis 34. In the described embodiment, the two areas or surfaces are mutually opositely inclined and differently oriented with respect to the axis 34. They are so inclined by mutually equal angles 48, 50 (FIG. 5). It will be readily appreciated that these angles need not be equal to each other and may vary as required for particular applications of vibration, wire size and pressures employed. In a preferred embodiment, each of the angles, 48, 50, is approximately 10°. Forward and rearward edges of each of the surfaces 44 and 46 are formed with a suitable curvature. Radius of this curvature in a preferred embodiment is approximately one thousandth of an inch for light wire. The radii of these edges 52, 54 and 56, 58, may be larger, in the order of three thousandths of an inch for heavy wire. However, for such heavy wire, the rear corner 58 of the second bond surface 46 will preferably be formed with a smaller radius of curvature or with a projecting lip as will be described below in connection with FIGS. 10, 11 and 12. Nevertheless, significant features of the dual side-by-side working heads of bonding wedge 30 are the oppositely directed inclinations of the two bonding surfaces.

Surface 44, which makes the first wire bond, tapers rearwardly and upwardly to provide a deformation of the bonded wire section having a congruent taper. Surface 46 tapers rearwardly and downwardly to likewise provide a deformation with a congruent taper. FIGS. 6–9 illustrate the improved wire deformation patterns, for first and second bonds, achieved by the bonding wedge of FIGS. 3, 4 and 5. As shown in FIGS. 6 and 7, a first bonded wire section, made by the first wire contacting area 44, has a pattern of deformation indicated generally at 60. This deformation tapers from a maximum depth (magnitude of deformation) at its outer or forward end 62 to a minimum depth or magnitude of deformation at its rearward or inner end 64. Thus, the inner end of the bonded wire section has relatively greater strength. Similarly, the configuration of the second wire contact area 46, which is specifically designed for the second bond, provides a pattern of deformation of the wire section at the second bond as illustrated in FIGS. 8 and 9. Here the deformation, generally indicated at 66, tapers outwardly from an inner end 68 of the bond section wherein the deformation is minimum, toward an outer end 70 of the bond section, where the deformation is of greater magnitude. Further, a stress riser may be introduced by a sharp corner at the heel of the bonding tool. Accordingly at this outer end 70, the wire section is relatively weakened and a relatively slight tensile force imparted to the wire will sever the wire precisely at this outer end of the second bond section.

Apparatus for holding, moving and operating the bonding wedge is described in detail below and illustrated in FIGS. 23 through 28. In use of the described multiface bonding tool, the first wire contact surface of the first working head, surface 44, is positioned over the section of the wire at which the first bond is to be made. The tool is then moved downwardly along the direction of its longitudinal axis 34, pressed against the wire and then vibrated to form the first bond, which has an optimum pattern of deformation as illustrated in FIGS. 6 and 7. The bonding wedge is then raised and moved rearwardly relative to the semiconductor chip and relative to the wire, the latter having its forward end bonded to the workpiece at the first bond. The bonding wedge is moved until it is substantially above the section of wire at which the second bond is to be made. Because the wire contact area of the second working head is positioned laterally of (e.g. transversely with respect to the longitudinal extent of the wire to be bonded) the first wire contact area, it is necessary that the bonding wedge be laterally shifted or that the wire be laterally shifted.

Relative motion of the wire and the wedge is necessary to position the wire in operative relation with respect to the second wire contact surface 46. This relative lateral motion may take place immediately after making the first bond, during the course of the rearward motion of the bonding tool, or after the bonding tool has obtained its second position in substantial registry with the point at which the second bond is to be made. In any event, the wire is laterally shifted relative to the bonding tool to position the wire under the second wire contact surface 46, the bonding wedge is again lowered to press the wire against the second contact pad of the circuit chip and the wedge is vibrated. This produces the second bond with a wire section having the deformation pattern illustrated in FIGS. 8 and 9. A tensile force is then applied to the wire, which precisely parts at its rearward or outer end 70. The parting tensile force is preferably applied while the tool is still pressed (but not vibrating) against the wire or it may be applied after the tool has been lifted. A technique for applying parting pressure while the tool is being vibrated has been originated by Michael C. Smith and is disclosed and claimed in his patent application for Method and Apparatus for Bonding and Breaking Leads to Semiconductors, Ser. No. 510417, filed on Sept. 30, 1974. The disclosure of the application of Smith is incorporated by this reference as though fully set forth herein.

Now the tool is prepared for a further pair of bonds. The wire must be paid out to be positioned under the first wire contact surface 44. However, because of the downward and rearward inclination of the second wire contact surface 46, this surface may block forward feeding of the wire from a position behind the bonding wedge. Accordingly, the wire is once again laterally shifted with respect to the bonding wedge upon completion of the second bond and parting of the wire. The shifting of the wire is in a direction opposite to the shifting that occurred between the first and second bonds. This once again positions the wire in operative relation to the first wire contact surface 44 whereupon the bonding wedge and the wire may be positioned relative to an area at which the next first bond of a pair is to be made.

MODIFIED BONDING WEDGES

As indicated above, the configuration of bonding wedge illustrated in FIGS. 3, 4 and 5 is primarily designed for light wire. It may be applied for bonding of heavy wire without change, or, by either increasing the inclination of the second wire contact surface 46, that is, by increasing the magnitude of the angle 48, or by decreasing the radius of the heel 58 of the second wire contact surface. Nevertheless, for certain bonding of heavy wire, it may be desirable to further insure precise parting of the wire at the outer end of the second bond. Accordingly, a configuration of a pair of side-by-side integral working heads as illustrated in FIGS. 10, 11 and 12, may be employed for such heavy wire. The bonding wedge of FIGS. 10–12 is similar to the bonding wedge previously described and includes an elongated body 132 having first and second working heads 144, 146, that provide wire contact surfaces of mutually opposite inclination with respect to the longitudinal axis 134 of the wedge. The angles of inclination may be substantially the same as previously described although the radii of corners 152, 154 and 156 may be enlarged, being approximately three thousandths of an inch for heavy wire. In this arrangement, however, the rear or heel of the wire contact area that makes the second bond is formed with a downwardly projecting lip 159 which will achieve a deformation pattern having an outer area of sharply increased magnitude of deformation, as illustrated in FIGS. 13 and 14. The projecting lip 159 provides a heel of greatly decreased radius of curvature thus provides a significally attenuated outer end of the second bond which may be readily parted precisely at the desired point by application of relatively light tensile force. The increased deformation achieved by lip 159 of the wedge of FIGS. 10–12 is designated at 161 in FIGS. 13 and 14.

Figure 16:
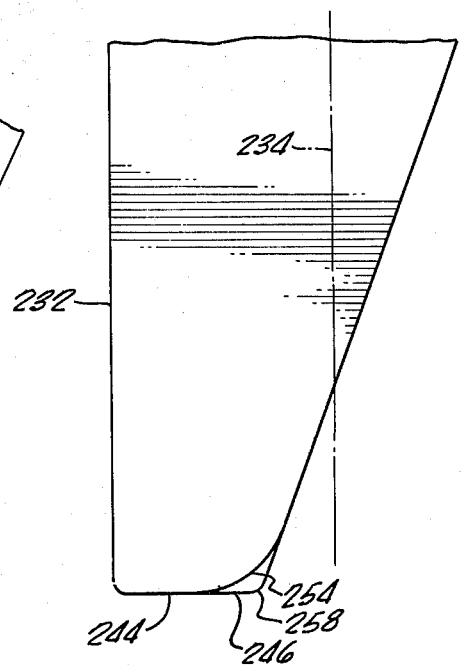
FIG. 16 is a side view of the bonding wedge of FIG. 15.

Illustrated in FIGS. 15 and 16 is still another modification of the side-by-side working heads for providing optimum deformation patterns on first and second bonds. In this arrangement, the surface 244 of the first working head is substantially flat and lies in a plane perpendicular to the longitudinal axis 234 of the wedge body. However, the rearward edge 254 of the first wire contact surface 244 is formed with a relatively large radius to provide an area of decreased deformation and decreased stressed risers at the rear or inner end of the first bond. The second working head has a substantially flat wire contact surface 246 which is formed with a heel 258 of relatively small radius of curvature that provides an area of increased deformation at the rear or outer end of the second bond to thereby facilitate parting of the wire precisely at the rear bond.

Figure 17:
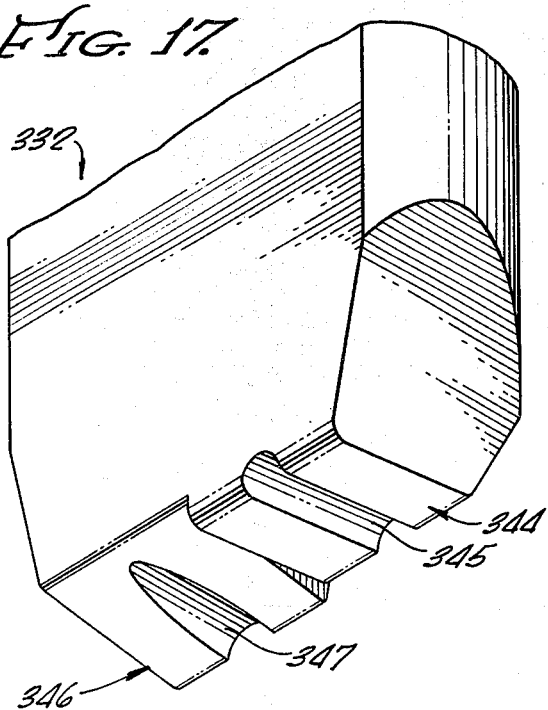
FIG. 17 illustrates a third modification of the bonding wedge, being a perspective view showing wire positioning grooves in the bond faces.
Figure 18:
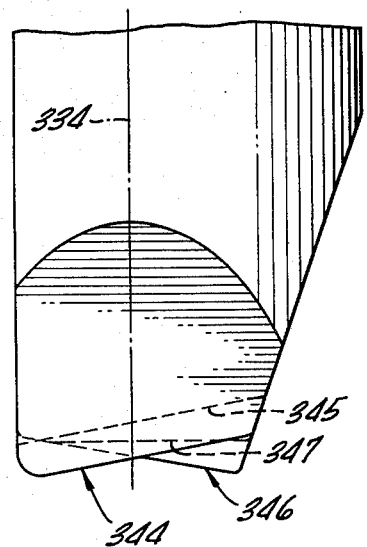
FIG. 18 is a side view of the wedge of FIG. 17.
Figure 23:
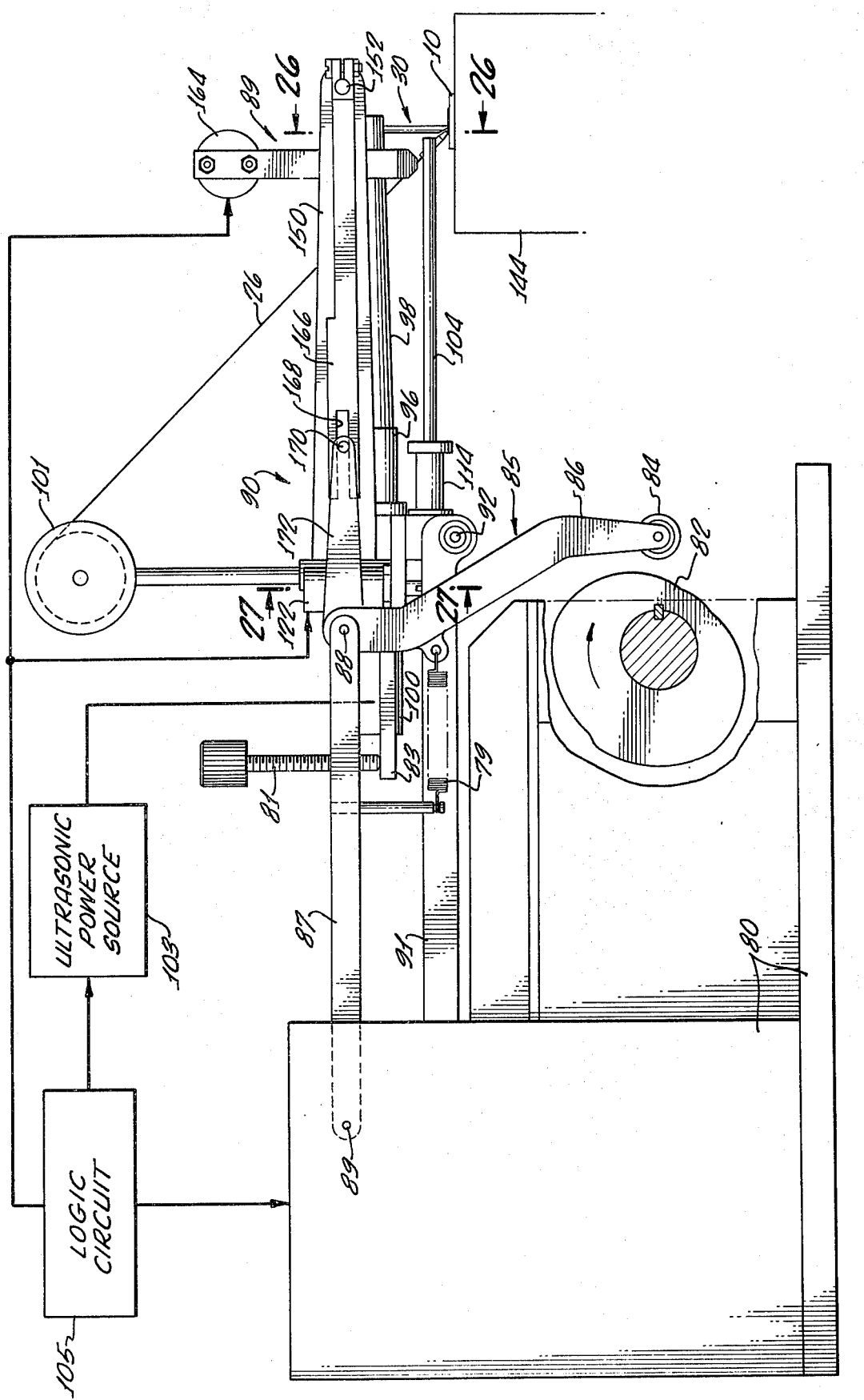
FIG. 23 is a side-elevational view of ultrasonic bonding apparatus employing a multiface bonding wedge of the present invention together with wire shifting means therefor.
Figure 24:
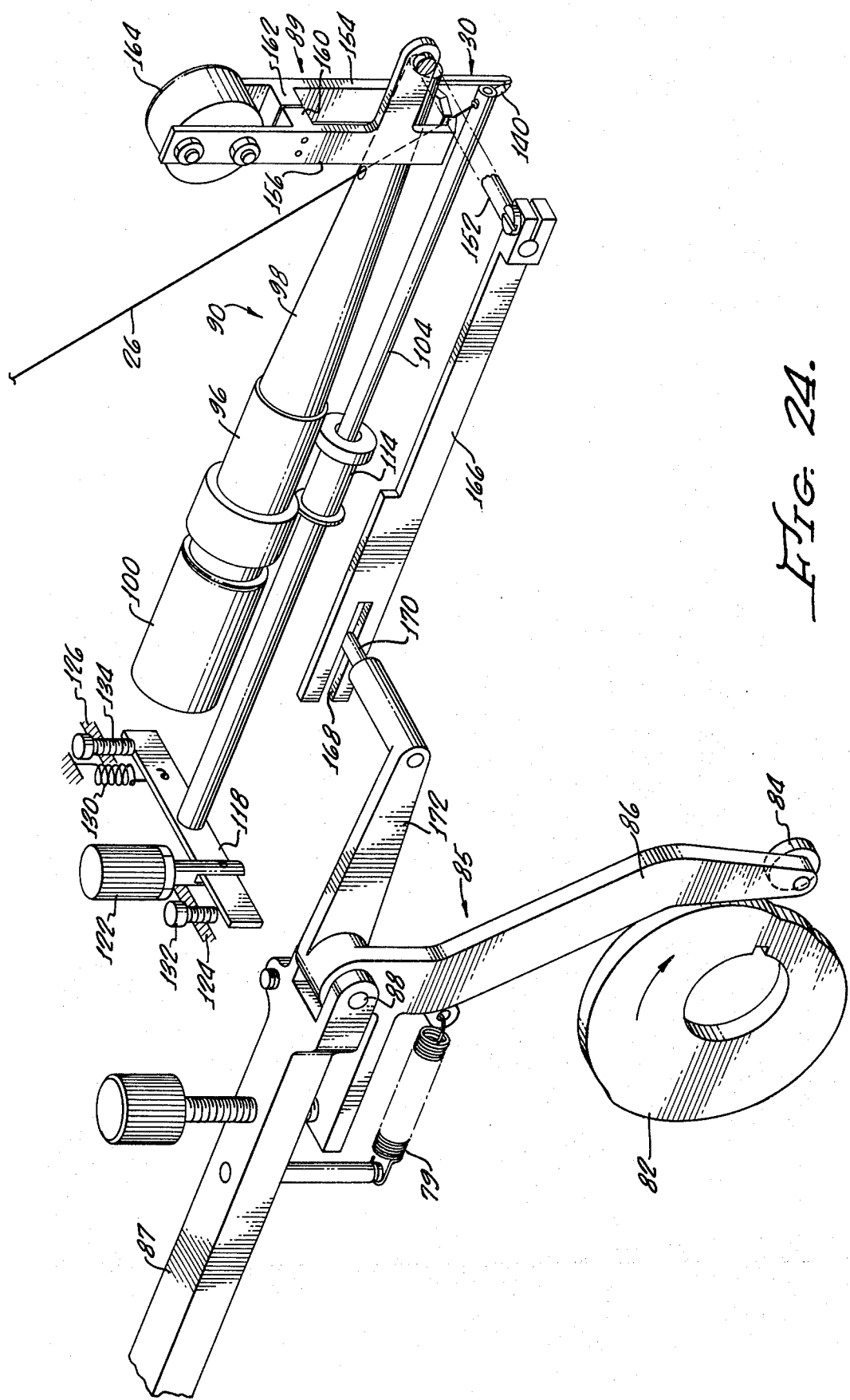
FIG. 24 is a perspective view of part of the apparatus of FIG. 23.
Figure 25:
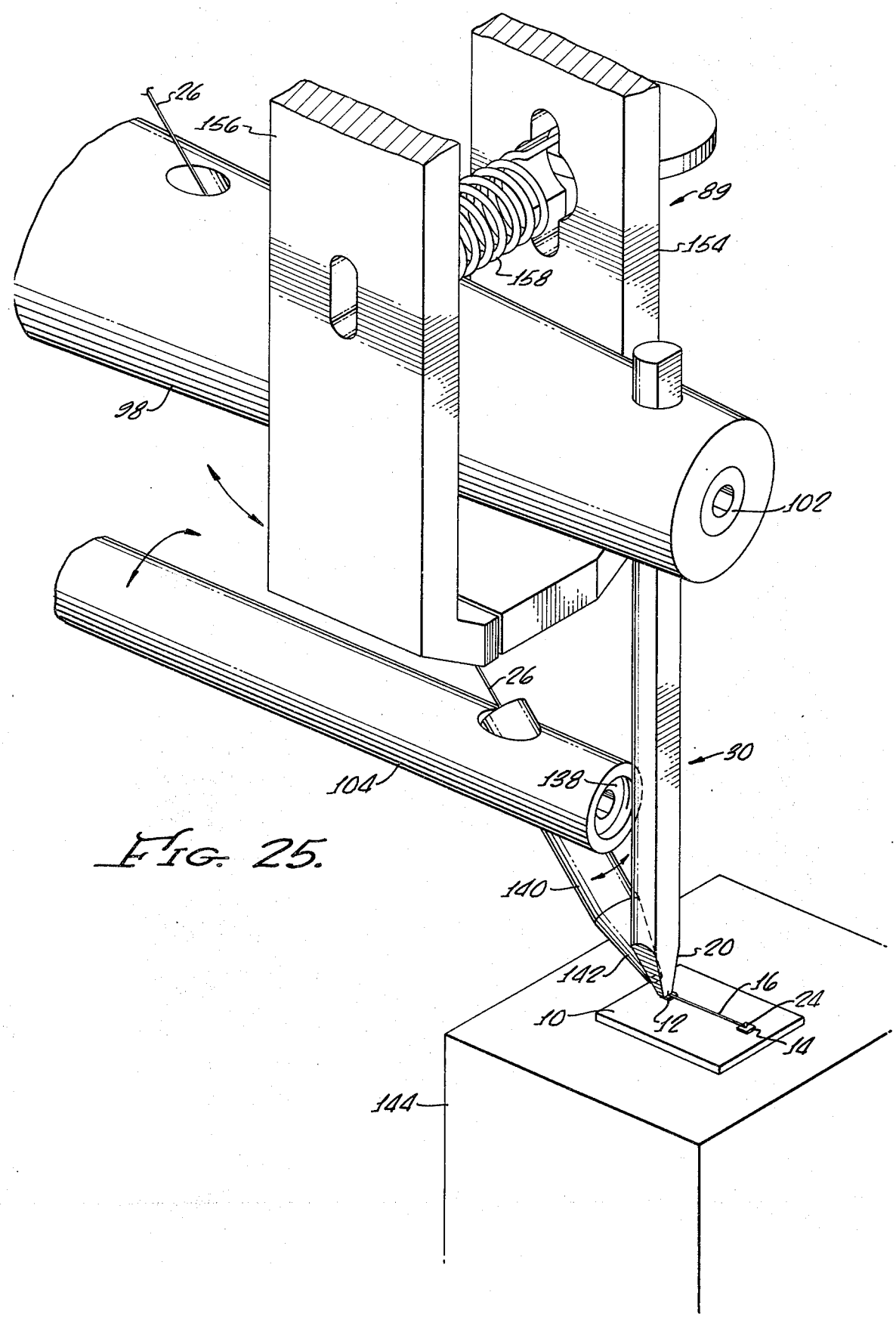
FIG. 25 is an enlarged view of parts of the apparatus of FIGS. 23 and 24, showing a wire being bonded.

It will be readily appreciated that various grooves and roughened surfaces and the like, may be provided in the wire contact surfaces to enhance gripping of the wire by the working head. Thus, as illustrated in FIGS. 17 and 18, an elongated bonding wedge 332 has a first working head 344 formed side by side and integrally with a second working head 346. The two working heads are formed with mutually oppositely inclined wire contact surfaces. In each of the surfaces is formed a respective one of grooves 345, 347 which are likewise oppositely inclined with respect to each other. Thus, the inclination of the grooves and of the wire contact surfaces provide the deformation patterns for the first bond and for the second bond which are optimum for each of these bonds, respectively. Grooves 345, 347 aid in lateral positioning, relative to the wedge, of the wire sections to be bonded.

Another modification of the wire contact areas of the dual working head bonding wedge is illustrated in FIGS. 19 and 20. In this arrangement, the bonding wedge 432 has a first wire contact area 444 adapted to make the first bond. The first wire contact area 444 is substantially flat, lying in a plane perpendicular to the tool axis 434 and may have a radius of curvature at each of its forward and rearward edges 452, 454 in the order of one to three thousandths of an inch. For making the second bond, wherein the inner end of the bond is to be of relatively high strength and the outer end of the bond is to have an increased deformation so as to be of relatively low strength, the wedge of FIGS. 19 and 20 includes an integral wire contact area 446 that is differently oriented than the surface of area 444, being upwardly and forwardly inclined with respect to the tool axis 434. Area 446 terminates in a rear edge 458 of a relatively small radius of curvature, such as one thousandths of an inch, for example. Thus, a weakened outer end of the second bond is achieved to facilitate parting.

In some situations, a single length of wire may be required to be bonded at three or more mutually spaced points along its length. Thus, a first bond of such a single wire optimumly will have a relatively high strength inner or rearward end and the last bond will have a relatively high strength inner or forward end. The last bond also will have a relatively low strength rearward or outer end to facilitate parting. One or more intermediate bonds are also made, preferably of uniformly higher strength at both ends.

For making such a multi-bond (three or more bonds) connection, a bonding wedge such as that illustrated in FIGS. 21 and 22 may be employed wherein three closely juxtaposed side-by-side working heads and wire contact areas are provided. In the modification of FIGS. 21 and 22, all of these working areas are formed as an integral part of a single bonding wedge 532. There is a first wire contact surface 544 configured and oriented substantially identically to any one of the previously described first wire contact area, such as, for example, the wire contact area 44 of FIGS. 4 and 5. Also included is a final wire contact area 546 configured and oriented just as one of the previously described second wire contact areas, such as, for example, wire contact area 46 of FIGS. 4 and 5. As described in detail in connection with the prior embodiments, the contact areas 544 and 546 are mutually oppositely inclined and differently oriented so as to provide the optimum wire deformation patterns illustrated in FIGS. 6 through 9, for example.

Integrally formed with the side-by-side contact areas 544 and 546 and interposed therebetween is a third wire contact area or bonding surface 545 which is employed to provide intermediate bonds. Preferably, the intermediate wire contact area 545 is flat, lying in a plane perpendicular to the tool axis 534, whereas the first wire contact area 544 inclines upwardly and rearwardly with respect to axis 534 and the second wire contact area 546 inclines upwardly and forwardly with respect to such axis. As previously described in connection with the use of other embodiments, the bonding wedge of FIGS. 21 and 22 is first positioned with the contact area 544 over the section of the wire first to be bonded, lowered and vibrated to make the first bond. Then the tool is lifted, moved rearwardly relative to the wire, and laterally shifted until the intermediate contact area 545 is positioned over the wire at a section thereof at which a second bond (an intermediate bond) is to be made. The tool is again lowered and vibrated to make the second bond. Additional intermediate bonds may be made as desirable. Thereafter, the tool is raised, once again moved rearwardly of the wire and once again, moved laterally with respect to the wire, to position the final wire contact area 546 over the wire. Now area 546 is moved downwardly to press against the wire and the final bond is achieved, facilitating parting, which is accomplished in a conventional manner as described herein.

Because of the small size of the workpiece and wires, and the relatively small distances between adjacent contact pads, it is desirable that the bonding wedge, and particularly all of the mechanism thereof that is to be positioned in proximity to the work, be as simple and as small as possible. Accordingly, the bonding wedges described herein are formed with their several juxtaposed working heads made integral with each other. Nevertheless, it will be readily appreciated that the two juxtaposed or side-by-side working heads and wire contact surfaces may be formed separately, to be moved either together or independently of each other, and further, may be formed to be either vibrated by a single transducer or by separate transducers, all without departing from principles of the present invention.

BONDING WEDGE OPERATING MECHANISM

Illustrated in FIGS. 23–28 is an exemplary mechanism for operating the multi-face bonding wedges described above and for effecting relative shifting of the wire and bonding wedge to enable the two (or more) bonding surface or wire contact areas to successively operate upon the wire.

The apparatus of FIGS. 23 through 28 is substantially identical to that disclosed in the above identified patent application of Michael C. Smith. The Smith application does not show the wire shifting arrangement of the present invention, but does disclose in greater detail, specific mechanisms, supports, control levers and adjustments for effecting the various motions and operations of the apparatus. Moreover, this apparatus is similar to that described in the above-identified patents to Pennings, but modified as described below to effect lateral wire shifting. A base or support 80 carries a motor driven rotating cam 82 which cooperates with a cam follower 84 to pivot a cam arm 86 of a bell crank 85 about an axis 88 on a support arm 87 that is pivoted to the support 80 at a pivot 89. It will be understood that the support carries a motor, various gears, cam, arms and other mechanisms (not shown), details of which are not necessary to an understanding of the present invention. One of such cams is cam 82. Clockwise urging of bell crank 85 to hold cam follower 84 against cam 82 is provided by a spring 79 connected between the bell crank and support arm 87. This clockwise bell crank motion is adjustably limited by a stop screw 81 threaded through support arm 87 to bear upon a tongue 83 that projects rearwardly from the bell crank. Bell crank 85 controls pivoted motion of a wire clamp 89 that tensions and feeds the wire 26, as will be more particularly described below.

A transducer assembly 90 is pivotally mounted on a shaft 92 to a support frame 91 carried by support 80 for vertical motion under control of mechanism (not shown). Details of the arrangement for moving the entire transducer assembly about its pivot 92, or vertically with support frame 91, form no part of the invention since many known arrangements and configurations for effecting a lifting and lowering of similar transducer assemblies, including those shown by the Pennings patents, are well known to those skilled in the art.

Briefly, the transducer assembly is raised or lowered under control of an operator by raising or lowering support frame 91, carrying the entire transducer assembly with it. The transducer assembly is pivoted about the axis of shaft 92 to precisely control the force applied to press the bonding tool upon the wire during bonding. A wire supply reel 101 is carried by the support frame 91 to feed the wire 26 through the wire clamp 89 to the working head of bonding wedge 30. Wire tension is varied under operator control, or automatically, in sychronism with the other steps in the bonding, to effect parting of the wire after the last bond and to grasp the wire for feeding from the supply. Details of such tensioning and feeding are described more particularly hereinafter. Tensioning and feeding may be conventional, as in the Pennings patents, or may be as described in the above identified application of Smith.

Transducer assembly 90 (FIGS. 24, 26, 27 and 28) comprises a transducer mounting frame or clamp 94 that is fixed to the journalled pivot shaft 92 and apertured to receive a connector element 96 that securely carries a transducer tool cone 98. At the other end of the connector element 96 is mounted an ultrasonic transducer 100 that is energized by a conventional ultrasonic power source 103 under control of a logic circuit 105. Fixedly secured to and projecting downwardly from the forward end of transducer tool cone 98 is a bonding wedge, such as the bonding wedge 30 of FIGS. 3, 4 and 5, or a modification thereof. Conveniently, the wedge is positioned for vertical adjustment within an aperture in the end of the tool cone 98 and locked therein by means of a set screw 102.

Clockwise pivotal movement of transducer assembly 90 about pivot shaft 92 (pressing the bonding wedge against the work-piece) is urged by a combination of the weight of the forward part of the transducer assembly and an adjustable spring bias means, such motion being limited by an adjustable stop. Details of these elements, not shown in the drawings, are not necessary for understanding of the present invention and, moreover, are fully disclosed in the above identified application of Michael C. Smith.

LATERAL SHIFTING

Relative lateral shifting of wire and bonding wedge can be effected by moving either the wire or the bonding wedge while the other is stationary, or by moving both. Practice of this invention requires only the resulting lateral displacement of the wire relative to the working heads. Motion of the wire laterally in relation to a relatively stationary bonding wedge is employed in the exemplary apparatus disclosed herein.

To effect positioning and relative lateral shifting of bonding wire respect to the working heads of the bonding wedge, there is provided a rigid elongated wire shifter shaft 104 that is fixedly mounted in a threaded adjustment shaft 106 (FIG. 28) carried in a pair of bearing assemblies 108, 110 that are secured to the transducer mounting frame 94. Accordingly, the wire shifter shaft 104 and adjustment shaft 106 are both rotatable in the bearing assemblies about the longitudinal axis 112 of shaft 104. Longitudinal adjustment of the wire shifter shaft is provided by an adjustment sleeve 114 having an internally threaded end engaging the externally threaded adjustment shaft 106 and butting, via an interposed washer 115, against the outer surface of bearing 108. A return spring 116 is compressed between a cross-arm 118, fixed to an outer end of the adjustment shaft 106, and a washer 117 at the second bearing 110. Accordingly, threaded rotation of the adjustment sleeve 114 in one direction will move the shaft 104 to the left, compressing the spring 116, whereas rotation in the other direction will allow the spring to move the shaft to the right (as viewed in FIG. 28). Thus, the shaft may be moved longitudinally toward and away from the bonding wedge 30 to adjust the position of the wire with respect to the wire contact areas of the wedge.

Fixed to an end of the shaft 106 is the pivot shaft cross arm 118 which extends perpendicular to the axis of the shifter shaft. The cross arm is pivotally connected, by means of a yoke 120, to a wire shifting solenoid 122 carried upon a solenoid support arm 124 fixed to the mounting block 94. A second support arm 126 fixed to the mounting block 94 carries a housing 128 in which is mounted a tension spring 130 connected between the housing 128 and cross arm 118. A pair of stop screws 132, 134 are threaded through the support arms 124, 126, respectively, for abutment with the cross arm 118 to limit pivotal motion of the cross arm and wire shifter shaft.

Adjustably mounted within an inclined aperture formed in the forwardly projecting end of wire shifter shaft 104, and secured therein by a set screw 138, is a wire guide 140 (FIGS. 1, 25, 28) in the form of a capillary tube having a feed end 142 that is positioned closely adjacent but not in contact with the rear face of bonding wedge 30. Wire guide 140 is inclined with respect to the axis of the wire shifter shaft and its feed end 142 projects downwardly and forwardly from the shifter shaft, being positioned at a distance from the shaft axis. A bonding wire 26 that is to be connected to and between contact pads on the workpiece which is carried by a work table 144, is guided by and through the capillary tube 140 and thence extends upwardly to wire spool 101 (FIG. 23) which provides the wire supply.

When solenoid 122 is energized, cross arm 118 has one of its ends pulled toward the solenoid and accordingly, the cross arm together with the wire shifter shaft affixed thereto, pivots in a counter clockwise direction as viewed in FIG. 27 until its motion is stopped by stop screw 132. Upon de-energization of solenoid 122, spring 130 pivots the cross arm together with the wire shifter shaft 104 in a clockwise direction as viewed in FIG. 27 until further motion is prevented by engagement with stop screw 134. As the cross arm and shifter shaft 104 pivot about the axis 112 thereof, the feed end 142 of the wire guide 140 is shifted laterally of the bonding wedge. Accordingly guide 140 is shifted from a first position in which the wire that protrudes from its feed end is in operation relation to the wire contact area of one of the working heads of the bonding wedge, to a second position in which the wire is in operative relation to the other of the wire contact areas of the bonding wedge working head.

Lateral shifting of the feed end of guide 140 and accordingly, of the wire which projects therefrom, is substantially linear since the radial distance of the feed end from axis 112 is relatively large and the distance of the shifting is relatively small, being typically in the order of about five thousandths of an inch for light wire and about 25 thousandths of an inch for heavy wire.

It deemed necessary or desirable, a third working head may be provided on any one of the bonding wedges described herein. Where the bonding wedge has three side-by-side working heads, each with a configuration uniquely designed to perform a particular type of bond, as in FIGS. 21 and 22, the wire shifter shaft may be selectively pivoted to laterally shift the feed end of the wire guide into operative relation with each of the three working heads.

Details of wire tensioning and feeding form no part of the present invention and a specific arrangement for wire tensioning and parting is fully described in the above identified patent application of Michael C. Smith. A simplified arrangement of the apparatus of Smith is shown herein as including a clamp support arm 150 fixedly carried by mounting block 94 and rotatably mounting a pivot shaft 152. Wire clamp 103 comprises a pair of levers 154, 156 having angulated lower ends that may be moved toward each other to grasp wire 26 therebetween. Levers 154, 156 are normally urged toward clamping position by a tension spring 158 connected between the levers below their common fulcrum which is provided by fulcrum arms 160, 162. The clamp is caused to release the wire by energization of a solenoid 164, connected to one of the levers and between the two above the fulcrum.

Pivot shaft 152 is rotated by a connecting link 166 fixed at one end to shaft 152. The other end of link 166 is slotted as at 168 to slidably receive a pin 170 fixed to a second arm 172 of bell crank 85.

OPERATION OF MECHANISM

In operation of the apparatus described and illustrated in FIGS. 23–28, wire is fed from supply reel 101 to project from the feed end 142 of the wire guide 140 to a position wherein the end of the wire is below the first working head, such as working head 44 for example, of the bonding wedge of FIGS. 3, 4 and 5. The transducer assembly is in a relatively upper position thereof by virtue of support frame 91 being in an upper position. A circuit chip 10 upon work table 144 (FIGS. 25) is now precisely positioned below the bonding wedge of manual munipulation of a chip holder of the work table. The entire transducer assembly is lowered by lowering support frame 91 until the first wire contact area 44 of the working head presses the end of the wire against the contact pad 14. The transducer is energized to vibrate the working head and wire to complete the first bond.

The transducer assembly is then lifted, being raised with frame 91, while solenoid 164 is energized to release the wire from the clamp. Raising the transducer assembly after making the first bond moves the guide 140 relative to the wire. As the bonding wedge is moved into position for the second bond, the wire clamp (in release position) is rotated clockwise (as viewed in FIG. 24) to move the clamp to the rear, away from wire guide 140 so as to position the clamp for parting the wire and for feeding more wire. With the bonding wedge raised, the wire shifter solenoid 122 is energized to shift the feed end of the wire guide laterally with respect to the bonding wedge and thereby position the wire in operative relation precisely under the second working head, the wire contact area 46 of the bonding wedge. Rotation of shaft 104 required to effect the necessary lateral displacement of the wire is generally less than 1°. The workpiece on the work table is vertically aligned precisely under the second working head, wire contact area 46. The solenoid 164 is now de-energized to clamp the wire. Frame 91 with transducer assembly 90 carried thereby is lowered to thereby press the second wire contact area 46 against the wire. The transducer 100 is again energized to vibrate the wire against the second contact pad 12 of the circuit chip 10 and to make a second bond. This second bond, as previously indicated, has a weakened or attenuated rearward end.

After the second bond has been completed the wire is parted precisely at the attenuated rearward end of the second bond. This is achieved (with the wire seized between the clamp jaws) by either further pivoting the clamp in a clockwise direction while the bonding wedge is still pressed upon the wire or lifting the entire transducer assembly (including the clamp which is carried thereby) to exert a parting tensile force on the wire. Because the rearward end of the second bond is the most weakened area of the wire (having an increased deformation), the wire not only parts precisely at such weakened area, but can be parted with application of smaller tensile force. Use of smaller tensile force for parting causes considerably less working and elongation of the wire between the clamp and second bond. Therefore such wire is in better condition for subsequent bonding and connections.

After parting the wire, the assembly is once again lifted from the workpiece, if it is not already raised. Wire must now be withdrawn from the reel and fed under the bonding wedge for subsequent bonding. However, in order that the advancing feed wire clear the rearwardly and downwardly inclined heel of the second wire contact area 46 of the second working head, the wire is laterally shifted back to a position at wire contact area 44. Thus, solenoid 122, which remained energized to hold the wire under area 46, is de-energized, allowing spring 130 (FIG. 27) to rotate the wire shifter shaft 104 and return the wire guide 140 to its first position. Now additional wire may be fed from the supply reel to pass under the rearwardly and upwardly inclined surface of the first wire contact area 44, and the assembly may be positioned to perform a second pair of bonds on the same or some other workpiece. Additional wire is withdrawn from the reel and wire pushed through the guide 140 by pivoting the clamp (in clamped position) about the axis of shaft 152 in a counter-clockwise direction, as viewed in FIG. 24. The clamp is pivoted in a clockwise direction (as viewed in FIG. 24) by clockwise rotation of cam 82 to a point where bell crank 85 is pivoted in a counter-clockwise direction about pivot 88 to raise the slotted end of link 166. Counter-clockwise pivoting of the clamp is achieved by force exerted by spring 79 when the cam has rotated further and cam follower 84 contacts a relatively lower (at a lesser radial distance from the cam center) of cam 82. Alternatively, wire may be pulled from the supply reel while the clamp is released and before the wire has been parted, by merely raising the transducer assembly to move the latter relative to the wire and pad to which it is bonded, then clamping the wire and lowering the assembly.

The above described operations and motions of the transducer assembly and clamp are preferably carried out as an automatically controlled sequence of steps initiated by the operator after positioning the chip under the raised bonding wedge. Such automatic operations and sequence of steps can be controlled by an arrangement of cams and electronic circuit logic 105. Alternatively each step may be manually controlled, it being understood that the operator is commonly provided with optical devices of high magnification to enable visual monitoring, and various motions (such as lateral wire shifting) are mechanically defined and limited in direction and magnitude.

The apparatus of FIGS. 23–28 is merely exemplary of various mechanizations of wire shifting means for use with the multiple working heads of the methods and tools of this invention. Other apparatus may be employed for relative wire shifting without departing from principles of the present invention.

There have been disclosed methods and apparatus for making multiple bonds upon a single filamentary wire without compromise of desirable characteristics of one of the bonds in order to accomplish another of the bonds. Use of closely juxtaposed working heads, each uniquely and specifically configured for making a particular one of the bonds of optimum characteristics and the shifting of the bonding wire relative to the working heads for operative engagement with the several heads one after the other provides a simple rapid and efficient bonding of greatly increased reliability.

The foregoing detailed description is to be clearly understood as given by way of illustration and example only, the spirit and scope of this invention being limited solely by the appended claims.

What is claimed is:

1. Wire bonding apparatus comprising
   a bonding wedge having first and second wire contact areas of mutually different orientation, a wire guide having a feed end adjacent said contact areas, and
   means for movably mounting said guide with respect to said wedge for motion between first and second positions at which a wire extending along said guide and from said feed end is in registry with said first and second contact areas, respectively, and one at a time.

2. The apparatus of claim 1 wherein said first and second contact areas are of mutually different inclination.

3. The apparatus of claim 2 wherein said motion of said guide is transverse to the longitudinal extent of a wire extending along said guide.

4. An ultrasonic wire bonding wedge comprising
   first and second side by side working heads having wire bonding surfaces that are oppositely inclined with respect to each other and mutually displaced in a direction transverse to the longitudinal extent of a wire to be bonded.

5. The wedge of claim 4 wherein one of said surfaces inclines upwardly and rearwardly, and wherein the other of said surfaces inclines upwardly and forwardly.

6. The wedge of claim 4 wherein one of said surfaces includes a downwardly projecting lip at a rearward end thereof.

7. The wedge of claim 4 wherein said workinig heads are formed integrally with each other.

8. A wire bonding tool adapted to bond a wire to a workpiece at points spaced along the length of the wire, said tool comprising
   a first working head providing a first wire contact area having a configuration constructed and arranged for making a first bond of said wire without significantly weakening the wire at said first bond,
a second working head mounted in closed juxtaposition to said first head, said second head providing a second wire contact area having a configuration constructed and arranged for making a second bond of said wire and for weakening said wire at said second bond,
said second wire contact area being displaced from said first wire contact area in a direction transverse to said length of the wire, whereby first and second bonds of said wire may be made by shifting the wire both longitudinally and laterally relative to said tool to place a first part of said wire in contact with said first wire contact area and to place a second part of said wire in contact with said second wire contact area, and whereby said wire may be readily parted at said second bond.

9. The tool of claim 8 including an elongated tool body carrying said working heads and having a longitudinal axis, said first and second wire contact areas having mutually different inclinations with respect to said axis.

10. The tool of claim 9 wherein said first and second contact areas are inclined with respect to said axis in mutually opposite senses.

11. The tool of claim 8 wherein said first wire contact area inclines upwardly and rearwardly with respect to said tool body and wherein said second wire contact area inclines upwardly and forwardly with respect to said tool body.

12. The tool of claim 8 wherein said second wire contact area includes a wire weakening portion having a relatively small radius of curvature to facilitate parting of said wire at an outer end of said second bond.

13. The tool of claim 8 including an elongated tool body carrying said working heads and having a longitudinal axis, said first wire contact area terminating at a rearward end thereof in a convex curve having a relatively large radius of curvature, said second wire contact area terminating at a rearward end thereof in a convex curve having a relatively small radius of curvature.

14. The tool of claim 13 including a tool body carrying said working heads and defining a longitudinal axis of the tool, at least one of said surfaces extending substantially normal to said axis.

15. The tool of claim 8 wherein said working heads are positioned side by side with respect to the longitudinal extent of the wire.

16. The tool of claim 15 wherein said working heads are formed integrally with one another.

17. The tool of claim 8 wherein at least one of said wire contact areas is formed with a wire positioning groove therein extending longitudinally of the wire to be bonded.

18. The tool of claim 8 including transducer means connected thereto for vibrating said working heads.

19. A method for bonding a wire to a workpiece at a plurality of points mutually spaced along the length of the wire comprising the steps of
pressing said wire over a first section of its length that is to form a first bond and deforming said section in a pattern of deformation that decreases in magnitude of deformation from a forward end of said first bond toward a rearward end thereof, and
pressing said wire against said workpiece at a second section of the wire that is to form another bond and deforming said second section in a pattern of deformation that increases in magnitude of deformation from a forward end of said second section toward a rearward end of said second section, whereby inner ends of said bonded wire sections are deformed less than outer ends of said bonded sections to provide greater strength at such inner ends than at such outer ends, concomitantly facilitating parting of the wire at the rearward end of said second section.

20. The method of claim 19 wherein said step of deforming said first section comprises effecting a pattern of deformation that tapers rearwardly from a greater depth of deformation at a forward end of said first section to a lesser depth of deformation at an inner end of said first section.

21. The method of claim 19 wherein said step of deforming said second section comprises deforming the wire at said second section with a deformation that tapers from a lesser depth of deformation at an inner end of said second section toward a greater depth of deformation at an outer end of said second section.

22. The method of claim 19 wherein at least one of said steps of pressing the wire against the workpiece includes the step of imparting a vibratory motion to the wire while it is so pressed.

23. The method of claim 19 wherein said step of deforming said second section includes the step of effecting a deformation that is significantly greater at an outer end of said second section than the deformation at an inner end of said second section, whereby said wire may be readily severed at such end of significantly greater deformation by applying a tensile force thereto.

24. The method of claim 19 wherein said steps of deforming the wire comprise the steps of engaging with said wire first and second working heads of mutually different configurations, and including the step of shifting the wire with respect to said working heads in both longitudinal and lateral directions between said first and second deforming steps.

25. The method of ultrasonically bonding a wire to two spaced points of a workpiece comprising the steps of
contacting a first section of the wire with a first working head of a bonding wedge,
vibrating said first working head to effect a first bond,
shifting said bonding wedge rearwardly and transversely with respect to the longitudinal extent of said wire,
contacting a second section of the wire with a second working head of the shifted bonding wedge, and
vibrating the second working head to effect a second bond.

26. The method of claim 25 wherein said steps of contacting said first section comprises contacting the wire with a first working head surface that inclines upwardly and rearwardly, and wherein said step of contacting said second section comprises contacting the wire with a second working head surface that inclines upwardly and forwardly.

27. The method of ultrasonically bonding a wire to two spaced points of a workpiece comprising the steps of
contacting a first section of the wire with a first working head of a bonding wedge,
vibrating said first working head to effect a first bond,
shifting said bonding wedge rearwardly and laterally with respect to the wire, contacting a second section of the wire with a second working head of the shifted bonding wedge, vibrating the second working head to effect a second bond, and parting said wire at said second bond and then shifting the bonding wedge laterally with respect to the wire in a direction opposite to the direction of said first mentioned lateral shifting in order to prepare for further bonds.

28. Wire bonding apparatus comprising a support, a work holder mounted to the support, a bonding wedge movably mounted to said support, said wedge having first and second working heads mounted in side by side relation and adapted to be moved to and from a workpiece carried by the work holder, a wire guide movably mounted to said support and having a wire feed adjacent said working heads, and means for effecting relative motion of said bonding wedge and wire guide transversely to the longitudinal extent of a wire to be bonded to position said wire feed in operative relation with respect to one or the other, but not both, of said working heads.

29. The apparatus of claim 28 wherein said wire guide comprises a wire feed tube having an axis inclined with respect to the axis of said bonding wedge and having a feed end thereof in close proximity to said working heads, and wherein said means for effecting relative lateral motion of said bonding wedge and wire guide comprises means for shifting said wire feed tube transversely of its own axis.

30. The apparatus of claim 29 wherein said means for shifting said feed tube comprises a wire shifter shaft movably mounted with respect to said bonding wedge, and means for securing said wire feed tube to said shifter shaft.

31. Wire bonding apparatus comprising a support, a work holder mounted to the support, a bonding wedge movably mounted to said support, said wedge having first and second working heads mounted in side by side relation and adapted to be moved to and from a workpiece carried by the work holder, a wire guide movably mounted to said support and having a wire feed adjacent said working heads, and means for effecting relative lateral motion of said bonding wedge and wire guide to position said wire feed in operative relation with respect to one or the other of said working heads, said wire guide comprising a wire feed tube having an axis inclined with respect to the axis of said bonding wedge and having a feed end thereof in close proximity to said working heads, and wherein said means for effecting relative lateral motion of said bonding wedge and wire guide comprises means for laterally shifting said wire feed tube, said means for shifting said feed tube comprising a wire shifter shaft movably mounted with respect to said bonding wedge, and means for securing said wire feed tube to said shifter shaft, being mounted for pivotal motion with respect to said bonding wedge about a pivot axis that is angulated with respect to said bonding wedge.

32. The apparatus of claim 31 wherein said pivot axis of said shifter shaft coincides with the longitudinal axis of said shaft and wherein said wire feed tube projects at an angle from an end of said shaft, whereby pivotal motion of said shaft about its axis will swing an end of said wire feed tube in a lateral direction with respect to said working heads.

33. The apparatus of claim 29 including a bonding wedge mounting block fixed to the bonding wedge for movably mounting the wedge to said support, said means for laterally shifting said wire feed tube comprising a crossarm pivoted to said mounting block, a return spring connected between said bonding wedge mounting block and one side of the crossarm, and a motive device connected to pivot the crossarm in opposition to the return spring.

34. Ultrasonic bonding apparatus comprising a support, a transducer tool cone mounted to the support for motion to and from a workpiece, a transducer connected to impart vibration to said tool cone, a bonding wedge carried by said tool cone and projecting therefrom, said bonding wedge comprising a pair of side by side working heads, said bonding wedge having an elongated body with a longitudinal axis, a wire shifter shaft mounted for pivotal motion relative to said tool cone about a second axis substantially normal to said longitudinal axis, a wire feed tube fixed to said shifter shaft and having a feed end positioned closely adjacent said working heads, and means for effecting limited pivotal motion of said shifter shaft about said second axis to effect lateral shifting of said feed end of said wire feed tube and also of a wire extending therethrough, with respect to said working heads, whereby a wire extending through said feed tube may be operatively positioned with respect to one or the other of said working heads.

35. The apparatus of claim 34 wherein said working heads have mutually different configurations to provide mutually different bonds upon a wire extending through said feed tube.

36. The apparatus of claim 34 wherein said working heads have mutually different inclinations with respect to the longitudinal axis of said bonding wedge.

37. The apparatus of claim 34 wherein said working heads are oppositely inclined with respect to the longitudinal extent of a wire extending through said feed tube.

38. The apparatus of claim 34 including means for adjustably moving said wire feed tube toward and away from said working heads.

39. The apparatus of claim 34 wherein at least part of one of said working heads includes a flat surface substantially perpendicular to the longitudinal axis of said bonding wedge.

* * * * *